(12) United States Patent
Duan et al.

(10) Patent No.: US 7,604,877 B2
(45) Date of Patent: Oct. 20, 2009

(54) FERROELECTRIC FILM WITH FERROELECTRIC DOMAIN ARRAY

(75) Inventors: Wen-Hui Duan, Beijing (CN);
Zhong-Qing Wu, Beijing (CN); Jian Wu, Beijing (CN); Bing-Lin Gu, Beijing (CN)

(73) Assignees: Tsinghua University, Beijing (CN);
Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 217 days.

(21) Appl. No.: 11/432,240

(22) Filed: May 10, 2006

(65) Prior Publication Data

US 2007/0072010 A1    Mar. 29, 2007

(51) Int. Cl.
*C30B 29/30* (2006.01)
*C30B 29/22* (2006.01)
*B32B 15/04* (2006.01)
*C30B 30/00* (2006.01)

(52) U.S. Cl. .............. 428/702; 349/167; 359/251; 365/117; 365/145

(58) Field of Classification Search .............. None
See application file for complete search history.

(56) References Cited

U.S. PATENT DOCUMENTS

| | | | |
|---|---|---|---|
| 3,970,959 A * | 7/1976 | Wang et al. | 372/96 |
| 6,013,221 A | 1/2000 | Bayer | |
| 6,926,770 B2 * | 8/2005 | Peng et al. | 117/2 |
| 2007/0152253 A1 * | 7/2007 | Lee et al. | 257/295 |

FOREIGN PATENT DOCUMENTS

CN    1184863 A    6/1998

OTHER PUBLICATIONS

Cho et al., "Terabit inch-2 ferroelectric data storage using scanning nonlinear dielectric microscopy nanodomain engineering system", Institute of Physics Publishing, Nanotechnology 14 (2003) 637-642, Apr. 17, 2003.*
S. V. Kalinin et. al., Atomic Polarization and Local Reactivity on Ferroelectric Surfaces: A New Route toward Complex Nanostructures, Nano Letters, 2002, 589-593, vol. 2, No. 6, American Chemical Society.
V. Berger, Nonlinear Photonic Crystals, Physical Review Letters, Nov. 9, 1998, 4136-4139, vol. 81, No. 19, American Physical Society.

* cited by examiner

*Primary Examiner*—John J. Zimmerman
*Assistant Examiner*—Aaron Austin
(74) *Attorney, Agent, or Firm*—D. Austin Bonderer

(57) ABSTRACT

A ferroelectric film includes a plurality of ferroelectric nanodomains configured in a regularly staggered fashion. The ferroelectric film has a quasi 2-dimensional configuration and is comprised of a ferroelectric material. A method for forming a ferroelectric film is also provided. A ferroelectric film comprised of a ferroelectric material is prepared. The ferroelectric film has a quasi 2-dimensional configuration and defines a direction that is normal to the quasi 2-dimensional configuration. An electric field along the normal direction is applied to the ferroelectric film, thereby the ferroelectric film having an array of ferroelectric nanodomains configured in a regularly staggered fashion is obtained.

7 Claims, 1 Drawing Sheet

FERROELECTRIC FILM WITH FERROELECTRIC DOMAIN ARRAY

BACKGROUND

1. Technical Field

This present invention relates to electric field poling techniques of a ferroelectric material and, more particularly, to a ferroelectric film with a ferroelectric domain array.

2. Discussion of the Related Art

Ferroelectric materials are characterized by multi-stable states with different spontaneous polarization. These multi-stable states can coexist in a ferroelectric material to form ferroelectric domains, and the ferroelectric domains could be changed by way of applying an external electric field to the ferroelectric material.

Some special ferroelectric domains have been found to be very important to modern technologies. For example, a periodic 180° ferroelectric domain is very useful for implementing the quasi-phase matching in nonlinear ferroelectric optical materials; a ferroelectrics with two-dimensional ordered ferroelectric domains (called nonlinear photonic crystal) can provide a valuable platform to study light-matter interaction in a highly nonlinear regime; and the ferroelectric nanodomains have been found to be very useful to assemble dissimilar nanostructures. Therefore, how to form a useful ferroelectric domain, especially a ferroelectric nanodomain becomes a very critical issue.

So far, several methods have been developed for producing a special ferroelectric domain, such as the chemical in-diffusion, electric field poling method, and electron beams or writing directly with probe tips. However, the chemical in-diffusion, and electron beams or writing directly with probe tips methods have a low efficiently to produce ferroelectric nanodomains. The electric field poling method, which applies an electric field on a bulk ferroelectric material, is a common technology to produce some special ferroelectric domains, such as periodic 180° ferroelectric domains. However, it is very difficult to produce a ferroelectric nanodomain.

What are needed, therefore, is to provide a ferroelectric film with an array of ferroelectric nanodomains.

SUMMARY

A preferred embodiment provides a ferroelectric film including: a plurality of ferroelectric nanodomains configured in a regularly staggered fashion. The ferroelectric film has a quasi 2-dimensional configuration and is comprised of a ferroelectric material.

Preferably, the ferroelectric film comprises plurality of unit cells and has a thickness in the range from about 2 to 100 unit cells.

In another embodiment, a method for forming a ferroelectric film includes the steps of: preparing a ferroelectric film comprised of a ferroelectric material, the ferroelectric film having a quasi 2-dimensional configuration and defining a direction that is normal to the quasi 2-dimensional configuration; and applying an electric field to the ferroelectric film along the normal direction, thereby obtaining the ferroelectric film having an array of ferroelectric nanodomains configured in a regularly staggered fashion.

Compared with the conventional electric field poling method, the method for forming a ferroelectric film with an array of ferroelectric nanodomains in accordance with the preferred embodiment is characterized in that applying a electric field to a ferroelectric film having a quasi 2-dimensional configuration, and the electric field needn't a complicated control due to the ferroelectric film used being very different from a bulk ferroelectric material. Accordingly, a plurality of ferroelectric nanodomains will conveniently self-organize in the ferroelectric film subjecting to the electric field poling, thereby, a ferroelectric film with a ferroelectric domain array is easily obtained.

Other advantages and novel features will become more apparent from the following detailed description of embodiments when taken in conjunction with the accompanying drawings.

BRIEF DESCRIPTION OF THE DRAWINGS

Many aspects of the invention can be better understood with reference to the following drawings. The components in the drawings are not necessarily to scale, the emphasis instead being placed upon clearly illustrating the principles of the present ferroelectric film with ferroelectric domain array and method for forming the same. Moreover, in the drawings, like reference numerals designate corresponding parts throughout the several views.

The exemplifications set out herein illustrate at least one preferred embodiment, in one form, and such exemplifications are not to be construed as limiting the scope of the ferroelectric film with ferroelectric domain array and method for forming the same in any manner.

DETAILED DESCRIPTION OF THE EMBODIMENTS

Reference will now be made to the drawings to describe preferred embodiments of the present ferroelectric film with ferroelectric domain array and method for forming the same in detail.

Figure 1:
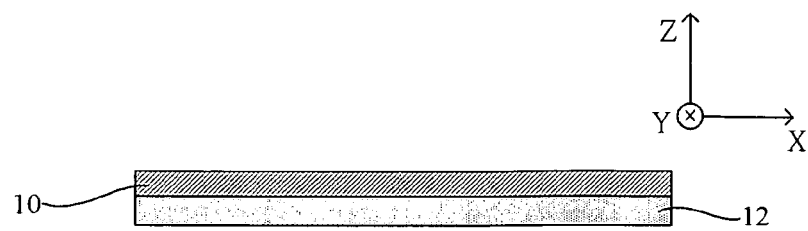
FIG. 1 is a schematic, cross-sectional view illustrating a ferroelectric film formed on a substrate in accordance with a preferred embodiment.
Figure 2:
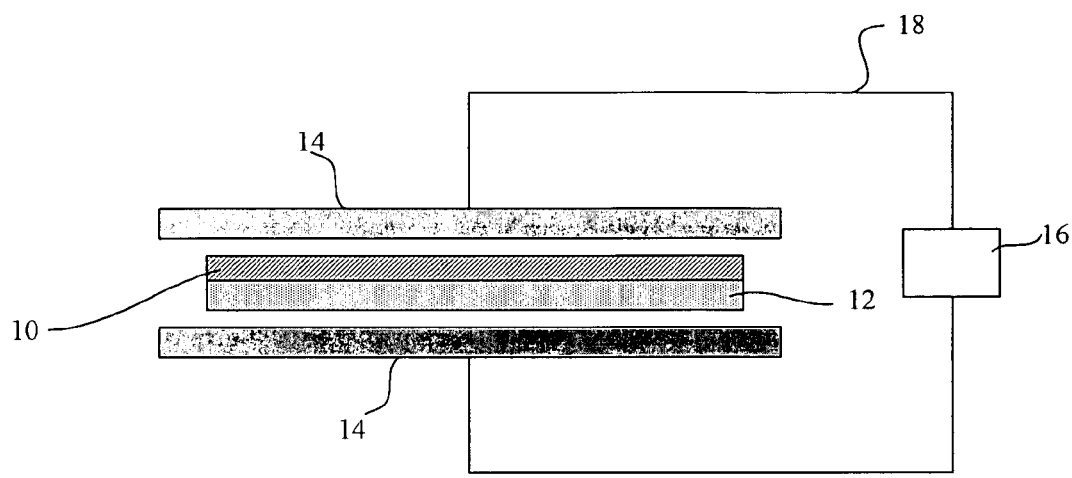
FIG. 2 is a schematic, cross-sectional view illustrating the ferroelectric film of FIG. 1 disposed between a pair of electrodes for being applied an electric field poling thereto.
Figure 3:
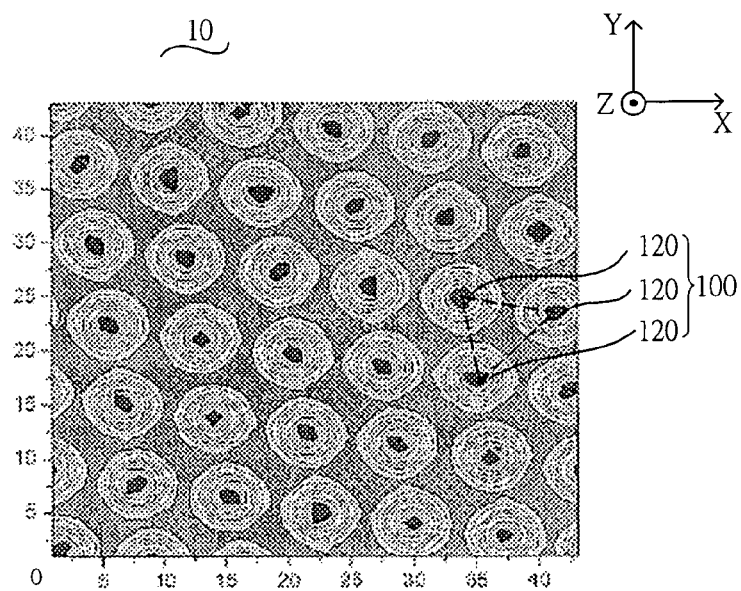
FIG. 3 is a distribution graph of a plurality of ferroelectric nanodomains formed in the ferroelectric film.

FIGS. 1 to 3 illustrate successive stages in a process for forming a ferroelectric film with an array of ferroelectric nanodomains in accordance with a preferred embodiment.

Referring to FIG. 1, a ferroelectric film 10 formed on a substrate 12 is provided. The ferroelectric film 10 has a quasi 2-dimensional configuration, and is comprised of a ferroelectric material. The ferroelectric film 10 generally comprises a plurality of unit cells. Advantageously, in a rectangular coordinate system, the ferroelectric film 10 has a thickness in the range from about 2 to 100 unit cells along the Z axis direction, where the Z axis direction is a direction that is normal to the ferroelectric film 10; and atoms constituting the ferroelectric film 10 are periodical distribution along the X and Y axes directions. The ferroelectric film 10 is formed on the substrate 12 by a deposition process, such as a molecule beam epitaxy process, a migration enhanced epitaxy process, a chemical beam epitaxy process, a metal-organic chemical vapor deposition process or a metal-organic molecular beam epitaxy process. While the thickness of the ferroelectric film 10 is no more than 10 unit cells, the influence of the substrate 12 is ought to imposed by confining the homogeneous in-plance compressive strain, namely, $\eta_1 = \eta \leq 2\%$ and $\eta_6 = 0$. The material of the ferroelectric film 10 can be lithium niobate ($LiNbO_3$), lithium tantalite ($LiTaO_3$), potassium niobate ($KNbO_3$), potassium tantalite ($KTaO_3$), lead zirconate titanium (PbZrTiO$_3$), lead magnesium niobate (PbMgNbO$_3$), potassium titanyl phosphate (KTiOPO$_4$), potassium titanyle arsenate (KTiOAsO$_4$), rubidium titanyl phosphate (RTiOPO$_4$), rubidium titanyl arsenate (RTiOAsO$_4$) or barium titanate (BaTiO$_3$), etc.

In the illustrated embodiment, the ferroelectric 10 is made from PbZrTiO$_3$, and has a size is 43×43×4 unit cells, the thickness of the ferroelectric film 10 is 4 unit cells approximately equal to 1.6 nanometers. The ferroelectric film 10 grows from the substrate 12 along crystal orientation [001] (labeled by Z) by a molecule beam epitaxy process, and atoms constituting the PbZrTiO$_3$ film are periodical distribution along crystal orientations [100] (labeled by X) and crystal orientation [010] (labeled by Y).

Referring to FIG. 2, the ferroelectric film 10 as shown in FIG. 1 is disposed in an electric field for applying an electric field poling thereto. The electric field is an approximately uniform electric field, and is provided by a pair of electrodes 14 which is connected to a constant current and high voltage source 16 via an external circuit 18. Alternatively, the electric field may be provided by any other apparatuses which can provide such a suitable electric field. Corresponding to the ferroelectric film 10 having a thickness in the range from about 2 to 100 unit cells, a threshold intensity, namely, minimum intensity of the electric field is in the range from about $1 \times 10^7$ to $5 \times 10^8$ volts per meter (V/m). It is recognized that the thicker of the ferroelectric film 10 the larger of the threshold intensity. The electric field may be applied globally (or locally) on the ferroelectric film 10 along the Z axis direction.

In the illustrated embodiment, the electric field generated by the electrodes 14 therebetween is globally applied (namely, the electric field appears in the whole ferroelectric film 10) to the ferroelectric film 10 along the Z axis direction, and the voltage applied between the pair of electrodes 14 is about 0.2 volt which can generate a approximately uniform electric field about $2 \times 10^8$ V/m. After the electric field poling is completed, an array of ferroelectric nanodomains 100 is globally formed in the ferroelectric film 10 as shown in FIG. 3. Alternatively, when an electric field is locally applied (namely, the electric field is applied only a part of the ferroelectric film 10) to the ferroelectric film 10, an array of ferroelectric nanodomains is formed in a local area of the ferroelectric film 10 after being applied the electric field poling.

Referring to FIG. 3, a ferroelectric film 10 with an array of ferroelectric nanodomains 100 globally formed therein is shown. The ferroelectric nanodomains 120 are configured in a regularly staggered fashion in the ferroelectric film 10. The arrangement of the ferroelectric nanodomains 120 in the ferroelectric film 10 indicates a well long-distance order. Each of the ferroelectric nanodomains 120 has a same polarization direction anti-parallel with the electric field applied to the ferroelectric film 10. Each of the ferroelectric nanodomains 120 has a circular contour. Preferably, all the circular contours of the ferroelectric nanodomains 120 are substantially the same, namely, the ferroelectric nanodomains 120 have substantially the same diameter; and each of the ferroelectric nanodomains 120 extends throughout the thickness of the ferroelectric film 10.

Furthermore, as indicated by the dash line equilateral triangle in FIG. 3, a distance between the centers of two adjacent ferroelectric nanodomains 120 is a constant corresponding to a ferroelectric film having a predetermined thickness, which is also referred to as crystal lattice constant. The maximum diameter of each of the ferroelectric nanodomains 120 is approximately equal to the crystal lattice constant. In the illustrated embodiment, the crystal lattice constant is approximately equal to 7 unit cells (about 2.8 nanometers).

Additionally, the crystal lattice constant is relevant to the thickness of the ferroelectric film 10, it is recognized that the thicker of the ferroelectric film 10 the larger of the crystal lattice constant. Corresponding to the ferroelectric film 10 having a thickness in the range from about 2 to 100 unit cells, the crystal lattice constant is in the range from about 1 to 100 nanometers.

Even further, when an intensity of a electric field applied on the ferroelectric film 10 is larger than the threshold intensity, the larger of the electric field intensity the smaller of the diameters of the ferroelectric nanodomains 120, while the crystal lattice constant keeping fixed. Generally, corresponding to the ferroelectric film 10 having a thickness in the range from about 2 to 100 unit cells, the diameters of the ferroelectric nanodomains 120 are in the range from 1 to 100 nanometers.

As stated above, then, we can conveniently attain a ferroelectric film with an array of ferroelectric nanodomians having a predetermined crystal lattice constant, and each of ferroelectric nanodomains having a predetermined diameter, by way of simply selecting a quasi 2-dimensional ferroelectric film having a predetermined thickness and adjusting the intensity of a electric field locally or globally applied to the ferroelectric film. Furthermore, the electric field needn't a complicated control due to the quasi 2-dimensional configuration of the ferroelectric film.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A ferroelectric film, comprising:
a plurality of ferroelectric nanodomains configured in a regularly staggered fashion, each of the ferroelectric nanodomains extending throughout the thickness of the ferroelectric film along a Z axis direction that is normal to the ferroelectric film plane created in the X and Y directions;
the ferroelectric film having a quasi 2-dimensional configuration along the X and Y axes directions and being comprised of a ferroelectric material, the ferroelectric film comprising a plurality of unit cells and has a thickness in the range from 2 to 100 unit cells.

2. The ferroelectric film according to claim 1, wherein the ferroelectric nanodomains have the same polarization direction.

3. The ferroelectric film according to claim 1, wherein the ferroelectric material is selected from the group consisting of lithium niobate, lithium tantalite, potassium niobate, potassium tantalite, lead zirconate titanium, lead magnesium niobate, potassium titanyl phosphate, potassium titanyle arsenate, rubidium titanyl phosphate, rubidium titanyl arsenate and barium titanate.

4. The ferroelectric film according to claim 1, wherein each of the ferroelectric nanodomains has a circular contour.

5. The ferroelectric film according to claim 1, wherein each of the ferroelectric nanodomains has a diameter in the range from 1 to 100 nm.

6. The ferroelectric film according to claim 1, wherein each of the ferroelectric nanodomains has substantially the same diameter.

7. The ferroelectric film according to claim 1, wherein a crystal lattice constant of the ferroelectric nanodomains is in the range from 1 to 100 nm.

* * * * *